US009762167B2

United States Patent
Ueda (10) Patent No.: US 9,762,167 B2
(45) Date of Patent: Sep. 12, 2017

(54) COMPUTER-READABLE STORAGE MEDIUM, GENERATING METHOD, GENERATING APPARATUS, DRIVING APPARATUS, PROCESSING APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Shinji Ueda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 214 days.

(21) Appl. No.: 14/519,878

(22) Filed: Oct. 21, 2014

(65) Prior Publication Data

US 2015/0116681 A1    Apr. 30, 2015

(30) Foreign Application Priority Data

Oct. 31, 2013    (JP) .................................. 2013-227536

(51) Int. Cl.
*H02P 23/04* (2006.01)
*G03F 7/20* (2006.01)
(Continued)

(52) U.S. Cl.
CPC ............ *H02P 23/04* (2013.01); *B23K 26/082* (2015.10); *G02B 26/101* (2013.01);
(Continued)

(58) Field of Classification Search
CPC ........................................................ H02P 23/04
(Continued)

(56) References Cited

U.S. PATENT DOCUMENTS

| 4,817,007 A * | 3/1989 | New ..................... G05B 19/184 |
| | | 318/571 |
| 7,768,225 B2 * | 8/2010 | Toyama ................. B23K 26/10 |
| | | 219/121.7 |

(Continued)

FOREIGN PATENT DOCUMENTS

| JP | 2011-253125 A | 12/2011 |
| JP | 2012-050273 A | 3/2012 |
| JP | 2013037448 A | 2/2013 |

OTHER PUBLICATIONS

European Search Report issued in European counterpart application No. EP14003575.9, dated Mar. 13, 2015.

*Primary Examiner* — David S Luo
(74) *Attorney, Agent, or Firm* — Rossi, Kimms & McDowell LLP (57) ABSTRACT

The present invention provides a computer-readable storage medium which stores a program for causing a computer to generate time-series data of an electric current to be supplied to a motor in order to cause, a control system, including the motor configured to drive an object, to transit from a first state to a second state, the program causing the computer to generate the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance.

23 Claims, 8 Drawing Sheets

(51) Int. Cl.
   *H02P 23/00* (2016.01)
   *G02B 26/10* (2006.01)
   *B23K 26/082* (2014.01)

(52) U.S. Cl.
   CPC ....... *G02B 26/105* (2013.01); *G03F 7/70383* (2013.01); *G03F 7/70725* (2013.01); *G03F 7/70758* (2013.01); *G03F 7/70783* (2013.01); *H02P 23/0077* (2013.01)

(58) Field of Classification Search
   USPC .................................................. 318/560, 600
   See application file for complete search history.

(56) References Cited

U.S. PATENT DOCUMENTS

| | | | |
|---|---|---|---|
| 8,503,124 B2 * | 8/2013 | Uchida | G11B 5/59622 360/55 |
| 2003/0147062 A1 | 8/2003 | Morisada | |
| 2005/0187650 A1 | 8/2005 | Toyama et al. | |
| 2009/0231566 A1 | 9/2009 | Schneiders et al. | |
| 2011/0297655 A1 | 12/2011 | Ueda | |

* cited by examiner

COMPUTER-READABLE STORAGE MEDIUM, GENERATING METHOD, GENERATING APPARATUS, DRIVING APPARATUS, PROCESSING APPARATUS, LITHOGRAPHY APPARATUS, AND METHOD OF MANUFACTURING ARTICLE

BACKGROUND OF THE INVENTION

Field of the Invention

The present invention relates to a computer-readable storage medium which stores a program for generating time-series data of an electric current to be supplied to a motor, a generating method, a generating apparatus, a driving apparatus, a processing apparatus, a lithography apparatus, and a method of manufacturing an article.

Description of the Related Art

A galvano device (galvanoscanner) is used in a laser processing apparatus (machine tool apparatus) such as a laser drilling apparatus, laser trimming apparatus, or laser repair apparatus. While controlling the rotation angle of a mirror attached to the rotating shaft of a motor, the galvano device reflects a laser beam by the mirror to irradiate a target position. When positioning the irradiation position of the laser beam to the target position, the rotation angle of the mirror needs to be controlled. Thus, the galvano device includes a detector (for example, a capacitance sensor or an optical or magnetic encoder) which detects the rotation angle of the mirror.

Since improvement of the productivity and improvement of the processing quality are requested of the laser processing apparatus, the motor of the galvano device needs to quickly position the mirror to a target position with high accuracy. In the galvano device, when the dynamic balance between the rotating shaft of the motor and the mirror is not achieved, or when a force generated by the magnet and coil of the motor contains a component other than a rotational component, a mechanical vibration mode in which the mirror inclines with respect to the rotating shaft of the motor is excited.

Japanese Patent Laid-Open No. 2011-253125 has proposed a technique of estimating an inclination response by using the model of a transfer function (transfer characteristic) regarding the vibration mode, and compensating for the inclination response by rotation of another motor. Japanese Patent Laid-Open No. 2012-50273 has proposed a technique of constraining the maximum value of the absolute value of a voltage to be applied to a motor, and generating time-series data of an electric current to be supplied to the motor in order to implement high-accuracy quick mirror positioning.

However, in the conventional technique of estimating an inclination response by using the model regarding the vibration mode, when an actual transfer function greatly fluctuates, the error of an inclination response (estimated value) estimated from the model may become large.

SUMMARY OF THE INVENTION

The present invention provides, for example, a technique advantageous in terms of obtaining time-series data of an electric current which is robust against fluctuation of a transfer function regarding a state quantity of an object.

According to one aspect of the present invention, there is provide a computer-readable storage medium which stores a program for causing a computer to generate time-series data of an electric current to be supplied to a motor in order to cause, a control system, including the motor configured to drive an object, to transit from a first state to a second state, the program causing the computer to generate the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

<First Embodiment>

Figure 1:
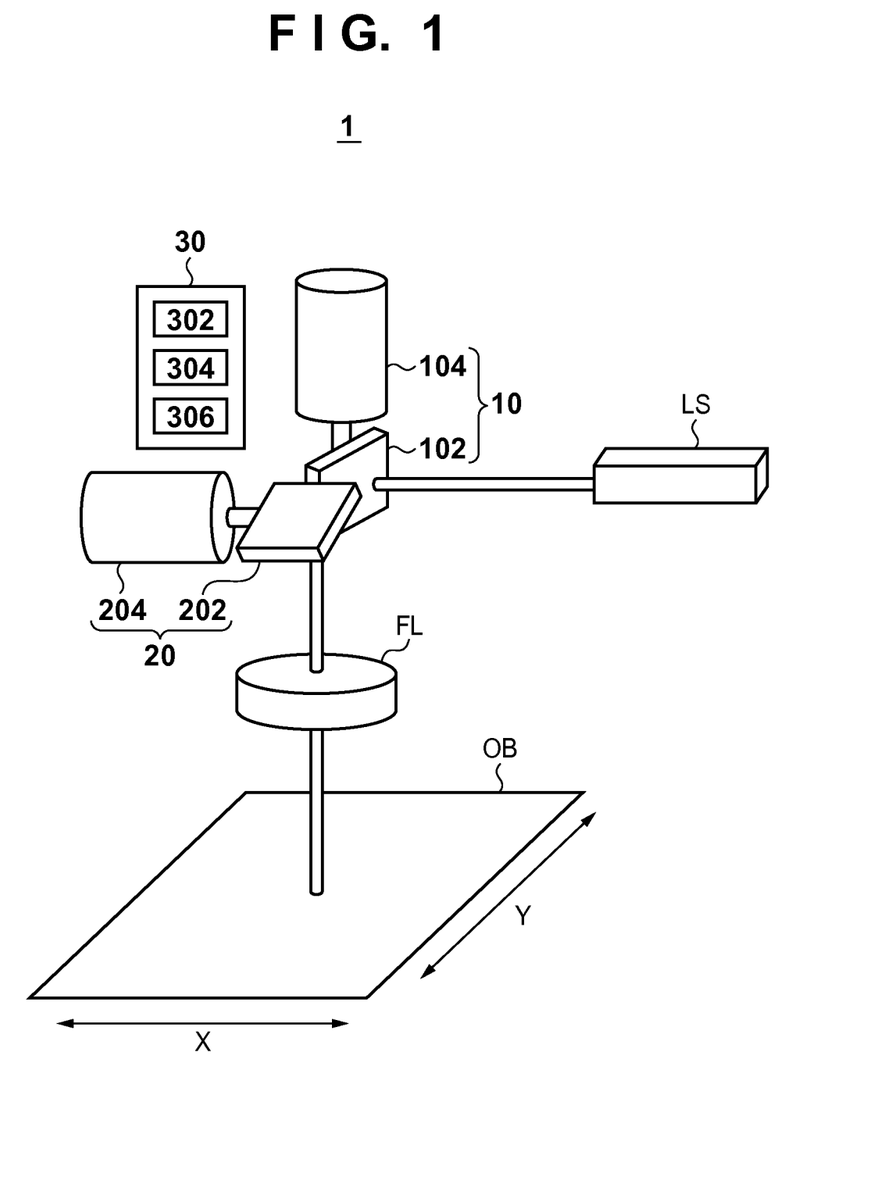
FIG. 1 is a schematic view showing the arrangement of a laser processing apparatus according to the first embodiment of the present invention.

FIG. 1 is a schematic view showing the arrangement of a laser processing apparatus 1 according to the first embodiment of the present invention. The laser processing apparatus 1 is an apparatus which irradiates a target object (object) OB with a laser beam to perform processing such as cutting, drilling, or welding on the target object OB. The laser processing apparatus 1 includes two galvano devices 10 and 20 having shafts (rotating shafts) perpendicular to each other, and a control device 30.

The galvano device 10 includes a mirror 102 and motor 104. The mirror 102 is attached to the rotating shaft (driving shaft) of the motor 104, and reflects a laser beam to another mirror (a mirror 202). The motor 104 is a DC servomotor which rotates the mirror 102 serving as a target object (transits the mirror 102 from an initial state (first state) to a final state (second state)), that is, controls the angle of the mirror 102.

The galvano device 20 includes the mirror 202 and a motor 204. The mirror 202 is attached to the rotating shaft of the motor 204, and reflects a laser beam to the target object OB. The motor 204 is a DC servomotor which rotates the mirror 202 serving as a target object (transits the mirror 202 from the initial state to the final state), that is, controls the angle of the mirror 202.

The control device 30 has a function of performing final-state control (FSC) on the galvano devices 10 and 20 (motors 104 and 204). The control device 30 includes a processing unit 302, D/A conversion unit 304, and supply unit 306.

The processing unit 302 includes, for example, a CPU and memory. The processing unit 302 performs processing of generating an electric current profile (time-series data) which determines and represents in time series the values of electric currents to be supplied to the respective motors 104 and 204 so that the rotation angles of the respective mirrors 102 and 202 become target angles. The processing unit 302 performs respective processes for generating an electric current profile by executing a program stored in, for example, a memory. However, an electric current profile generated by performing processing for generating an electric current profile by an external information processing apparatus (for example, computer) may be stored in the memory of the processing unit 302.

The D/A conversion unit 304 converts a digital electric current profile (digital signal) input from the processing unit 302 into an analog electric current profile (analog signal), and inputs the analog electric current profile to the supply unit 306.

The supply unit 306 includes, for example, a linear amplifier (electric current amplifier) driven by a bridge. The supply unit 306 supplies, to the respective motors 104 and 204, electric currents corresponding to electric current profiles (electric current command values) generated by the processing unit 302. The supply unit 306 can perform electric current feedback control so that electric current command values and the values of electric currents to be supplied to the respective motors 104 and 204 become equal to each other.

In the laser processing apparatus 1, a laser beam emitted by a laser source LS is reflected by the respective mirrors 102 and 202 of the galvano devices 10 and 20, and irradiates the target object OB via an Fθ lens FL. The laser processing apparatus 1 uses the galvano devices 10 and 20 as scanning units for scanning a laser beam on the target object OB. The galvano device 10 (mirror 102 and motor 104) and the galvano device 20 (mirror 202 and motor 204) will be explained as a galvano device (mirror and motor) without distinction.

Figure 2A:
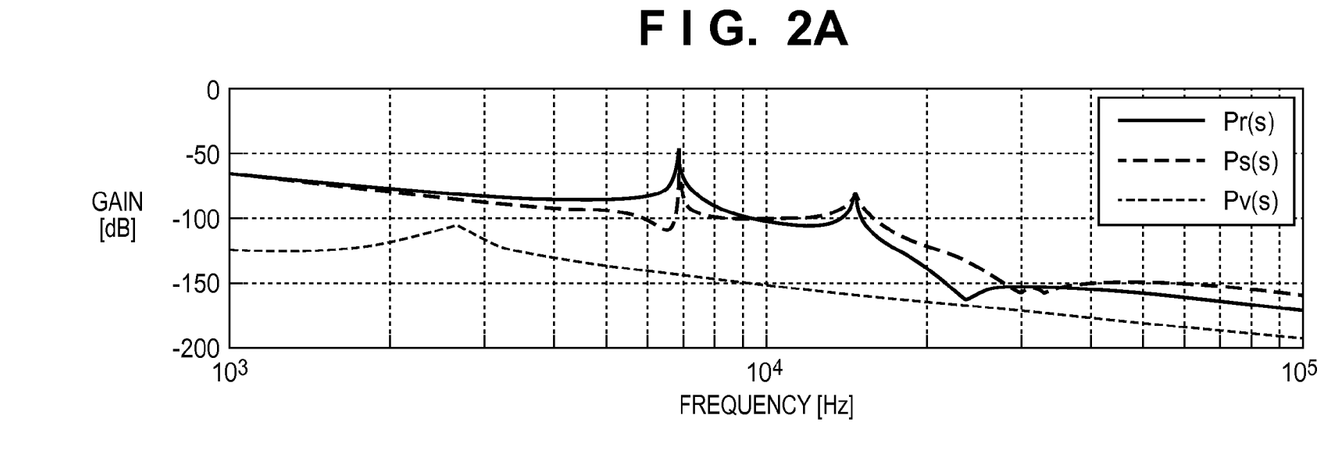
FIGS. 2A and 2B are graphs showing frequency characteristics from an electric current command value to a motor, up to the rotation angle of a mirror, the inclination angle of the mirror, and the output of an encoder which detects the rotation angle of the mirror.
Figure 2B:
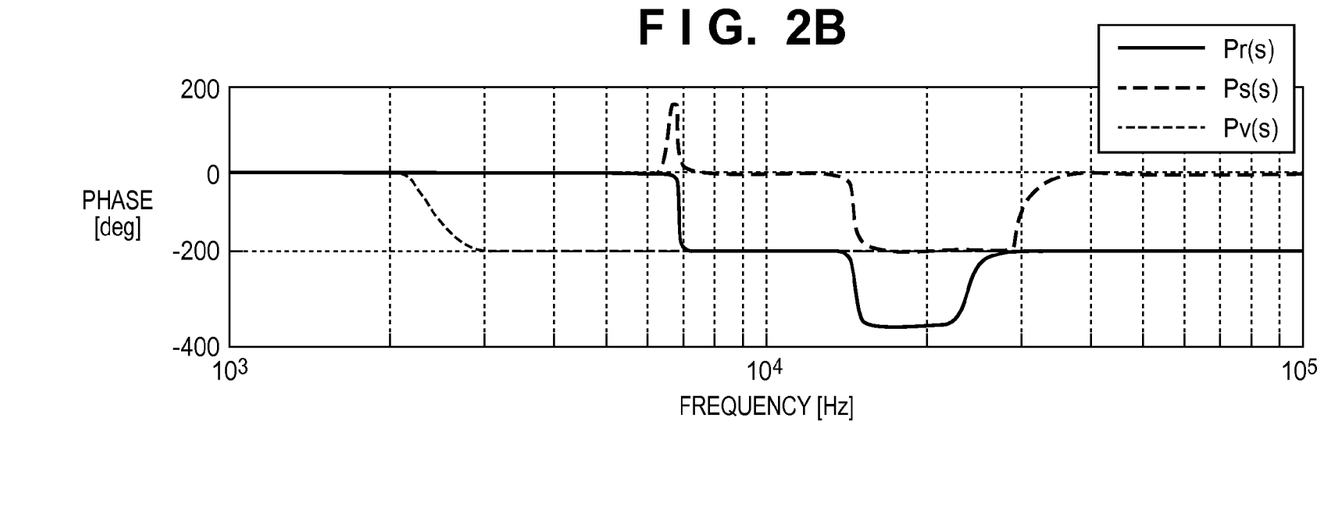

In the galvano device, a mechanical resonance mode (vibration mode (specific mode)) exists in directions in which the mirror twists and inclines with respect to the rotating shaft of the motor. FIGS. 2A and 2B show frequency characteristics from an electric current command value $i_{ref}$ to the motor, up to a rotation angle $y_r$ of the mirror, an inclination angle $y_v$ of the mirror, and an output (detected angle) $y_s$ of an encoder which detects the rotation angle of the mirror. In FIG. 2A, the abscissa represents the frequency [Hz], and the ordinate represents the gain [dB]. In FIG. 2B, the abscissa represents the frequency [Hz], and the ordinate represents the phase [deg]. $P_r(s)$, $P_v(s)$, and $P_s(s)$ are mathematical models (transfer characteristics) from the electric current command value $i_{ref}$ to each motor, up to the rotation angle $y_r$ of the mirror, the inclination angle $y_v$ of the mirror, and the output $y_s$ of the encoder which detects the rotation angle of the mirror. In the resonance mode in the twist direction, the resonance frequency is high in comparison with a required control band, and the track can be designed not to excite the resonance mode. A feedback controller can also be designed to have attenuation.

It is known that the resonance frequency of inclination vibrations of the mirror is lowest in the resonance mode of the galvano device. If the controller includes a notch filter not to excite inclination vibrations, the positioning performance (rotation angle control) of the mirror may degrade. Since the resonance mode in the inclination direction exists in the control band, it is difficult to implement the quick positioning operation of the mirror by considering, in the track design, not to excite the resonance mode.

In practice, for example, the laser processing apparatus 1 continuously forms many holes. To do this, the laser processing apparatus 1 repeats an operation of positioning the mirror of the galvano device at an angle corresponding to a processing position, and emitting a laser beam in a state in which the mirror stands still. In one mirror positioning operation, inclination vibrations of the mirror are sufficiently small with respect to a requested position accuracy. However, when the mirror positioning operation is performed continuously, vibration waves sometimes overlap each other, which hinders high-accuracy processing.

Referring to FIGS. 2A and 2B, the galvano device is apparently a system which has a rigid-body characteristic in a low frequency region and has two resonance characteristics in a high frequency region. Therefore, the frequency response of the galvano device is modeled by the following transfer function constituted by a rigid-body mode, two resonance modes, and the idle time (delay characteristic in the electric current amplifier):

$$P_s(s) = P_{mech}(s)e^{-\tau_d s}$$

$P_{mech}$ is a transfer function expressed by a sum of a rigid-body mode $P_n$, resonance mode $P_1$, and resonance mode $P_2$, as represented by:

$$P_{mech}(s) = P_n(s) + P_1(s) + P_2(s) \tag{1}$$

where $P_n(s)$ is given by the following equation (2), and $P_i(s)$ is given by the following equation (3):

$$P_n(s) = \frac{k_0}{s^2} \tag{2}$$

$$P_i(s) = \frac{k_i}{s^2 + 2\zeta_i \omega_{ni} s + \omega_{ni}^2} \quad (i=1, 2) \tag{3}$$

Referring to FIGS. 2A and 2B, the system has one resonance characteristic for a response from the electric current command value up to the inclination angle of the mirror. It is known that the resonance frequency fluctuates upon temperature fluctuations or a change over time in the resonance mode in the inclination direction of the mirror. From this, the resonance mode $P_{vi}$ in the inclination direction of the mirror including characteristic fluctuations is given by:

$$P_{vi}(s) = \frac{k_{vi}}{s^2 + 2\zeta_{vi} \omega_{vi} s + \omega_{vi}^2} \quad (i = 1, 2, \ldots, 11) \tag{4}$$

In the following description, attention is paid to only inclination vibrations of the mirror, that is, the inclination angle of the mirror without taking account of twist vibrations of the mirror.

Figure 3:
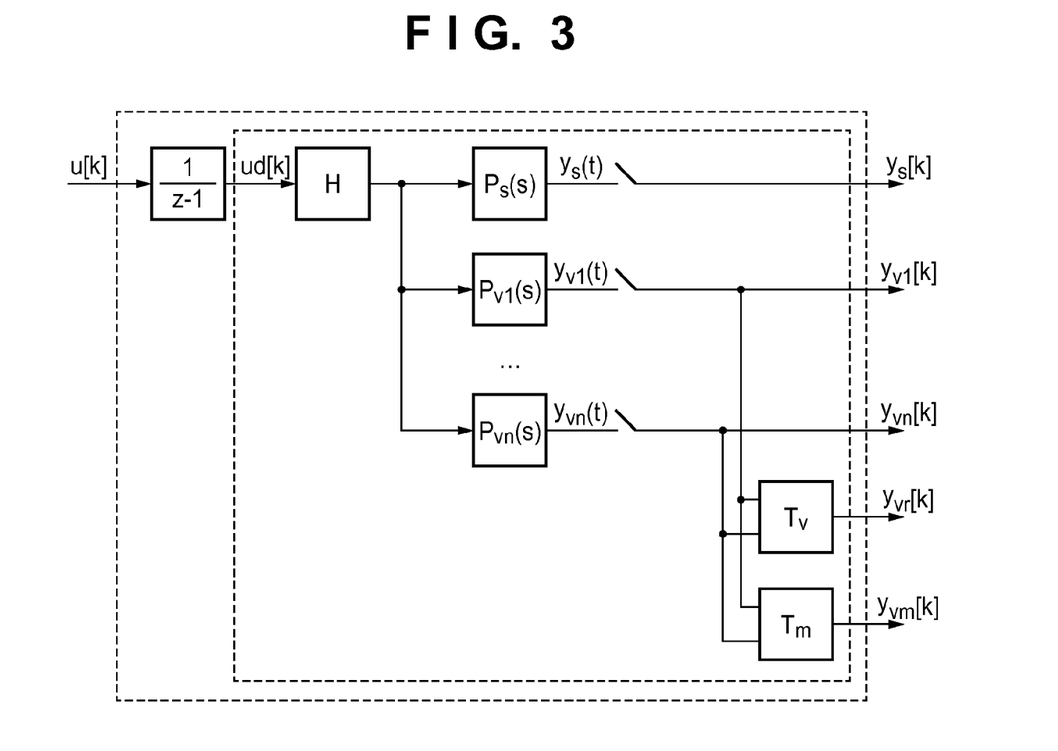
FIG. 3 is a diagram showing the augmented system of a control target including inclination vibrations of the mirror.

FIG. 3 is a diagram showing the augmented system of the control target including inclination vibrations of the mirror. In FIG. 3, $P_s$ is the model of a continuous-time system up to the encoder output response with respect to the electric current command value (model for estimating the rotation angle of the mirror from the electric current command value). $P_{vi}$ is the model of a continuous-time system up to the inclination angle response of the mirror with respect to the electric current command value (model for estimating the inclination angle of the mirror (state quantity of the vibration mode) from the electric current command value).

As described above, in the galvano device, the resonance frequency sometimes fluctuates as for the resonance mode in the inclination direction of the mirror. A case in which the fluctuation of the resonance frequency is ±5%, and n=11 models $P_{vi}$ {i=1, ..., 11} in 1% steps will be examined. In other words, a plurality of models corresponding to respective different operating environments of the motor of the galvano device will be examined. The operating environment includes the temperature of a space in which the motor of the galvano device is arranged. The following track design is performed so that the responses of a plurality of models satisfy control specifications. $y_{vr}[k]$ represents the dispersion of responses from models of inclination vibrations of the mirror at time k, as represented by:

$$y_{vr}[k] = T_v y_v[k] \quad (5)$$

where $T_v$ is a matrix for calculating the dispersion of a plurality of responses obtained from the respective models of inclination vibrations of the mirror at time k. Here, the matrix $T_v$ includes all combinations for extracting two responses from 11 responses:

$$T_v = \begin{bmatrix} 1 & -1 & 0 & \cdots & \cdots & 0 \\ \vdots & 0 & -1 & 0 & \cdots & 0 \\ \vdots & \vdots & \vdots & \vdots & \vdots & \vdots \\ 1 & 0 & \cdots & \cdots & -1 & 0 \\ 1 & 0 & \cdots & \cdots & 0 & -1 \\ \vdots & \vdots & \vdots & \vdots & \vdots & \vdots \\ 0 & \cdots & 0 & 1 & 0 & -1 \\ 0 & \cdots & 0 & 1 & 0 & -1 \\ 0 & \cdots & \cdots & 0 & 1 & -1 \end{bmatrix}$$

$$y_{vm}[k] = [y_{c1} \ \cdots \ y_{cn}]^T$$

$y_{vm}[k]$ is the center value of a plurality of responses obtained from the respective models of inclination vibrations of the mirror at time k. $T_m$ is a calculation equation for obtaining the center of a plurality of responses obtained from the respective models of inclination vibrations of the mirror. More specifically, according to the calculation equation $T_m$, the maximum and minimum values of a plurality of responses at time k are obtained, and the center value between the maximum and minimum values is obtained and output.

Figure 4:
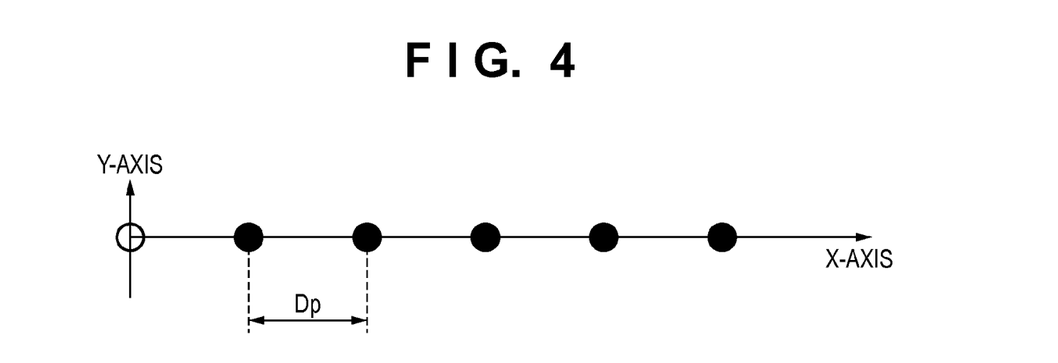
FIG. 4 is a view showing an example of actual processing in the laser processing apparatus.

The track design in actual processing in the laser processing apparatus 1 will be examined. A case will be considered, in which the laser processing apparatus 1 forms five 1-mmφ holes at an interval $D_p=1$ mm in the scanning direction of the motor of the galvano device, for example, an X-axis motor, as shown in FIG. 4. In FIG. 4, a filled point indicates a position where a hole is formed. In the track design, assume that holes are formed without any error in the X-axis direction, and holes are formed with an error of ±1 μm or smaller in the Y-axis direction. The processing time for the forming is 100 μs. The track is designed to satisfy these constraints.

Figure 5A:
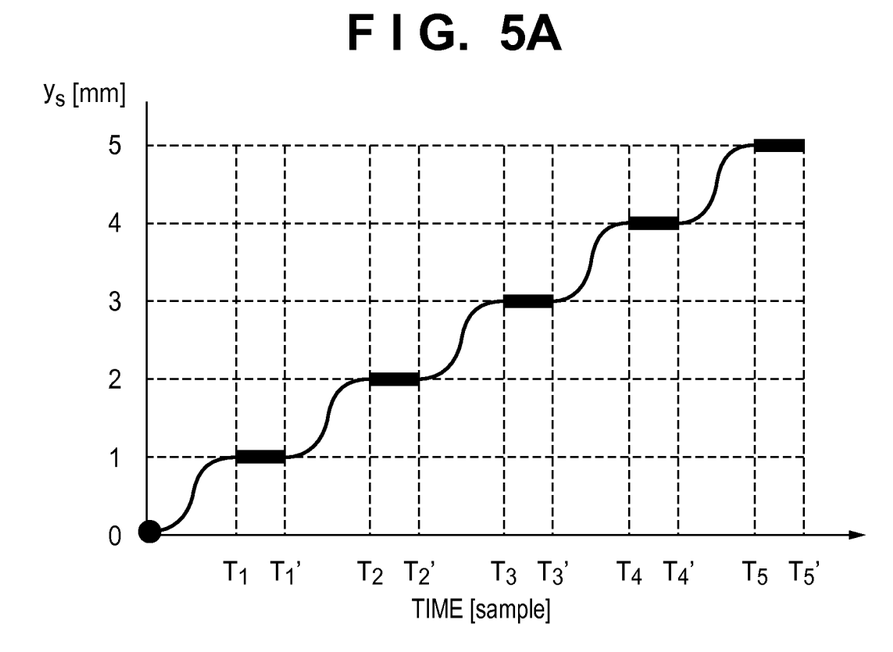
FIGS. 5A and 5B are views showing the constraints of the track design in the laser processing apparatus.
Figure 5B:
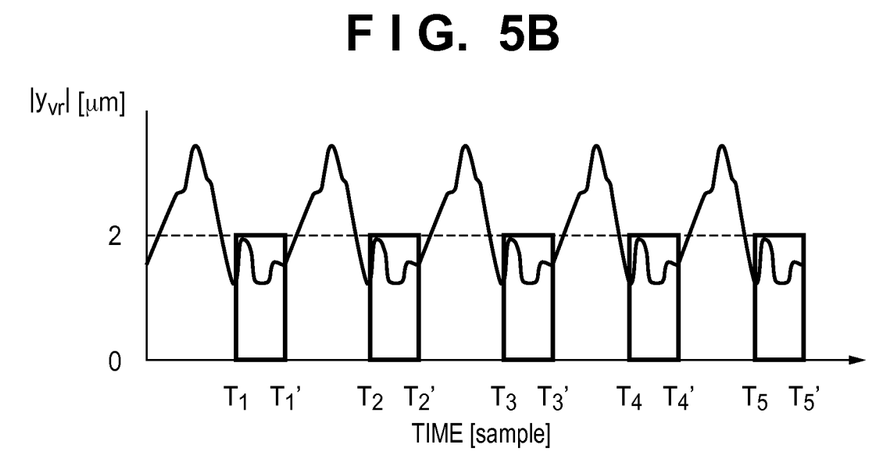

Next, the constraints of the track design in the laser processing apparatus 1 will be examined. FIGS. 5A and 5B are views showing the constraints of the track design in the laser processing apparatus 1. In FIG. 5A, the abscissa represents the time, and the ordinate represents the encoder output $y_s$. In FIG. 5B, the abscissa represents the time, and the ordinate represents the (width of) dispersion $y_{vr}$ of the response of the model of inclination vibrations of the mirror. In FIGS. 5A and 5B, thick lines indicate constraints. $T_1, \ldots, T_5$ are the processing start times of the first to fifth holes, and $T_1', \ldots, T_5'$ are the processing end times of the first to fifth holes.

The interval between time $T_1$ and time $T_1'$ is the time for performing drilling processing. The encoder output represents that a hole is positioned at a 1-mm position without any error, and the dispersion of the response (inclination angle) of the model of inclination vibrations of the mirror is constrained within 2 μm. The encoder output also represents that constraints are similarly set even for the second to fifth holes. The track is designed to satisfy these constraints.

Figure 6:
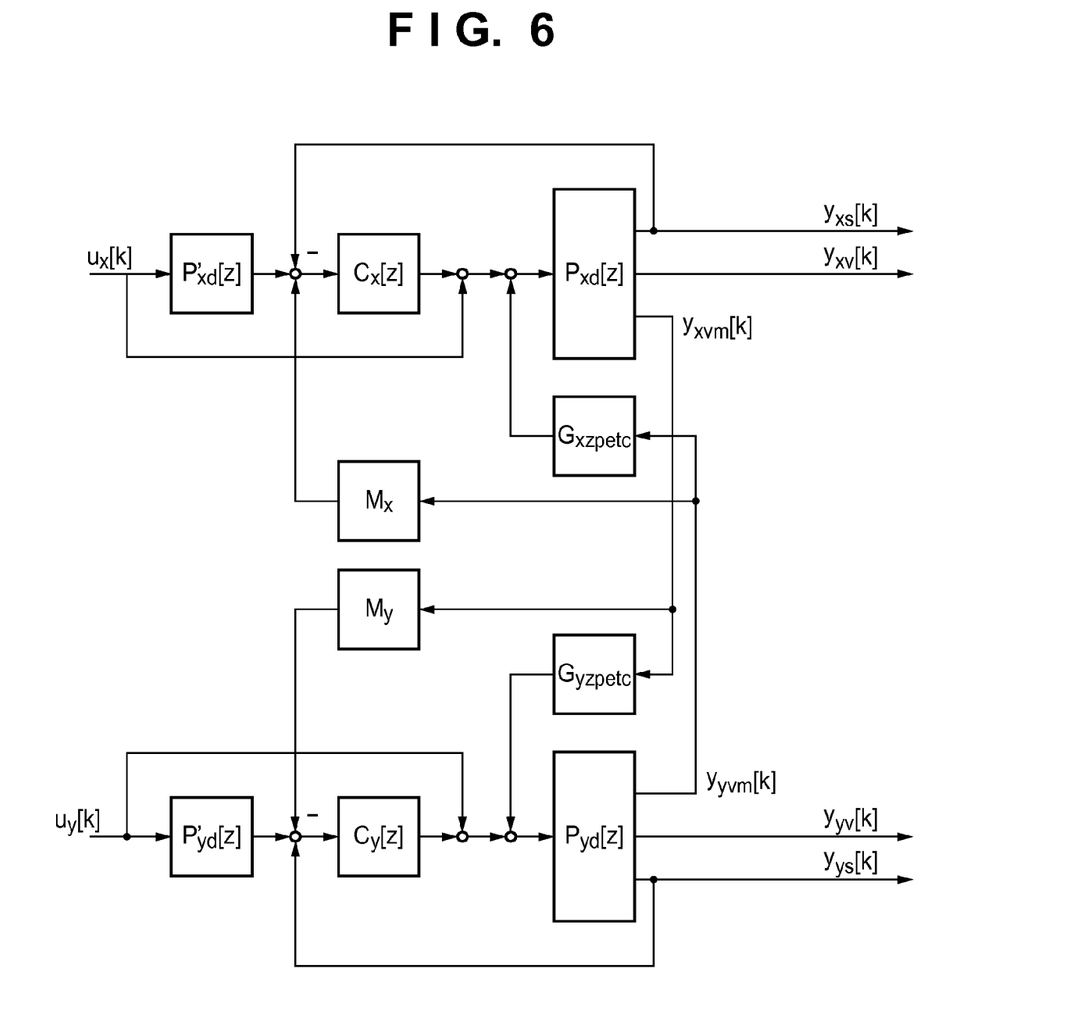
FIG. 6 is a diagram showing a control system which compensates for inclination vibrations of the mirror of a galvano device in the laser processing apparatus.

FIG. 6 is a diagram showing a control system which compensates for inclination vibrations of the mirror of the galvano device in the laser processing apparatus 1. In the laser processing apparatus 1, the two motors (X-axis motor and Y-axis motor) of the two galvano devices are arranged so that their rotating shafts are perpendicular to each other. $P'_{xd}[z]$ is the plant model of a discrete-time system in the X-axis, and is a model for estimating the encoder output $y_{xs}[k]$ with respect to the electric current input value $u_x[k]$. The model $P_{xd}[z]$ is obtained by discretizing the model $P_s(s)$ of the continuous-time system. $P_{xd}[z]$ is the plant model of the discrete-time system in the X-axis, and is a model for estimating the encoder output $y_{xs}[k]$, the inclination angle $y_{xv}[k]$ of the mirror, and a center value $y_{xvm}[k]$ of the inclination angle of the mirror with respect to the electric current input value $u_x[k]$. $C_x[z]$ is the feedback controller of the discrete-time system in the X-axis. $M_x$ and $G_{xzpetc}$ constitute a track tracking control system designed in zero phase error tracking control (ZPETC), and represent that the inclination angle of the mirror is compensated for by the other motor.

Similarly, $P'_{yd}[z]$ is the plant model of a discrete-time system in the Y-axis, and is a model for estimating the encoder output $y_{ys}[k]$ with respect to the electric current input value $u_y[k]$. $P_{yd}[z]$ is the plant model of the discrete-time system in the Y-axis, and is a model for estimating the encoder output $y_{ys}[k]$, the inclination angle $y_{yv}[k]$ of the mirror, and a center value $y_{yvm}[k]$ of the inclination angle of the mirror with respect to the electric current input value $u_y[k]$. $C_y[z]$ is the feedback controller of the discrete-time system in the Y-axis. $M_y$ and $G_{yzpetc}$ constitute a track tracking control system designed in zero phase error tracking control (ZPETC), and represent that the inclination angle of the mirror is compensated for by the other motor.

The resonance frequency of inclination vibrations of the mirror is lower than the resonance frequency of twist vibrations, and falls in the control band of the other motor. The center value of the inclination angle of the mirror can be satisfactorily compensated for by the other motor. It is only necessary to reduce (the upper limit value of) the dispersion of a plurality of responses obtained from the respective models of inclination vibrations of the mirror until a necessary processing accuracy is obtained. In other words, an accuracy necessary in drilling processing can be satisfied if the dispersion of a plurality of responses obtained from the respective models of inclination vibrations of the mirror is suppressed within 2 μm or smaller.

A track design in which the dispersion of a plurality of responses obtained from the encoder output (response), and the respective models of inclination vibrations of the mirror will be explained. Referring to FIG. 3, a system $P_d[z]:=(A_d, B_d, C_d, 0)$ in which the input is $u_d[k]$, the output is the encoder output $y_s[k]$, and the difference between responses obtained from the respective models of inclination vibrations of the mirror is $y_{vr}[k]$ is given by:

$$A_d=\mathrm{diag}(A_{sd}, A_{v1}, \ldots, A_{vn})$$

$$B_d=[B_{sd}, B_{v1}, \ldots, B_{vn}]^T$$

$$C_d=\mathrm{diag}(1, T_v) \mathrm{diag}(C_{sd}, C_{v1}, \ldots, C_{vn}) \quad (6)$$

where $P_{sd}[z]:=(A_{sd}, B_{sd}, C_{sd}, 0)$ $P_{v1}[z]:=(A_{v1}, B_{v1}, C_{v1}, 0)$, $P_{vn}[z]:=(A_{vn}, B_{vn}, C_{vn}, 0)$, and $y[k]=[y_s[k], y_{vr}[k]]^T$.

$P_{sd}[z]$ is a system in which the model $P_s(s)$ of the encoder output is discretized by zero-order hold in the sampling time τ. $P_{vi}[z]$ (i=1, . . . , n) is a system in which the model $P_{vi}(s)$ of inclination vibrations of the mirror is discretized by the zero-order hold in the sampling time τ. In FIG. 3, the input u[k] of the augmented system is set with respect to the input $u_d[k]$.

A system P[z]:=(A, B, C, 0) in which the input is u[k], the output is the encoder output $y_s[k]$, and the difference between responses obtained from the respective models of inclination vibrations of the mirror is $y_{vr}[k]$ is given by:

$$A = \begin{bmatrix} A_d & B_d \\ 0 & 1 \end{bmatrix} \quad (7)$$

$$B = \begin{bmatrix} 0 \\ 1 \end{bmatrix}$$

$$C = [C_d \quad 0]$$

Final-state control (FSC) will be explained. Final-state control is a control method of changing a target object to a final state designated by a finite time by adding a feedforward input to a given system. A case in which an input u[k] for controlling an initial state x[0] to an output y[N] in N (≥m) steps is obtained with respect to a control system P[z] will be examined. Substituting k=0, 1, . . . , N−1 into k of the m-order control system P[z] yields:

$$y[N]=C(A^N x[0]+\Sigma U) \quad (8)$$

where $$\Sigma=[A^{N-1}B \; A^{N-2}B \ldots B] \quad (9)$$

$$U=[u[0] u[1] \ldots u[N-1]]^T$$

Since A and B can be controlled and N≥m is satisfied, Σ is a square regular matrix or a row full-rank rectangular matrix in equation (9). If Σ is a square regular matrix, U satisfying equation (8) is one. In general, however, the step count N is much larger than the order m of a control target object. Thus, Σ is a row full-rank rectangular matrix, and U satisfying equation (8) is not one.

In final-state control, therefore, the input U which minimizes the following equation (10) is obtained based on equation (8):

$$J=U^T QU, Q>0 \quad (10)$$

The minimization problem of equation (10) based on equation (8) can be solved by a Lagrange's undetermined multiplier, as represented by:

$$U=Q^{-1}\Sigma^T(\Sigma Q^{-1}\Sigma^T)^{-1}(x[N]-A^N x[0]) \quad (11)$$

The thus-obtained feedforward input will be called an FSC input, and a track obtained from the FSC input will be called an FSC track.

Conventionally, when input saturation or the like is considered in final-state control, it is formulated as LMI (Linear Matrix Inequality). However, in final-state control considering constraints, input saturation or the like can also be formulated as a quadratic programming problem, so the solution can be obtained more quickly than by LMI.

The quadratic programming problem is formulated as a problem in which an equality condition represented by equality (12) and an inequality condition represented by inequality (13) are satisfied, and an objective function regarding U represented by equation (14) is minimized:

$$A_{EQ}U=b_{EQ} \quad (12)$$

$$A_{INEQ}U \le b_{INEQ} \quad (13)$$

$$J=U^T QU, Q>0 \quad (14)$$

Note that the inequality condition with respect to the vector represented by inequality (13) is assumed to take an inequality for each element.

The equality condition represented by equation (8) corresponds to the equality condition represented by equality (12), and the objective function represented by equation (10) corresponds to the objective function represented by equation (14). Hence, normal final-state control can be solved by quadratic programming. Further, even a constraint such as input saturation can be handled by using the inequality condition represented by inequality (13).

Considering this, a constraint variable z[k] is defined by the linear sum of the state x[k] and input u[k] of the augmented system, as represented by:

$$z[k]=C_z x[k]+D_z u[k] \quad (15)$$

A constraint represented by inequality (16) is set with respect to the constraint variable z[k], as represented by:

$$|z[k]| \le z_{max} \quad (16)$$

Sequentially substituting 0, 1, . . . , N−1 into k in equation (15) yields:

$$\begin{cases} z[0] = C_z x[0] + D_z u[0] \\ z[1] = C_z Ax[0] + C_z Bu[0] + D_z u[1] \\ \quad \vdots \\ z[N-1] = C_z A^{N-1} x[0] + \ldots + D_z u[N-1] \end{cases} \quad (17)$$

Equations (17) are expressed in a matrix form:

$$Z = \Phi_z x[0] + \Omega_z U \quad (18)$$

where $$Z = [z[0], \ldots, z[N-1]]^T \quad (19)$$

-continued $$\Phi_z = \begin{bmatrix} C_z \\ C_z A \\ \vdots \\ C_z A^{N-1} \end{bmatrix} \quad (20)$$

$$\Omega_z = \begin{bmatrix} D_z & 0 & \cdots & 0 \\ C_z B & D_z & \ddots & \vdots \\ \vdots & \ddots & \ddots & 0 \\ C_z A^{N-2} B & \cdots & C_z B & D_z \end{bmatrix} \quad (21)$$

The constraint represented by inequality (16) can be represented as two inequality conditions with respect to U:

$$\Omega_z U \leq Z_{max} - \Phi_z x[0] \quad (22)$$

$$-\Omega_z U \leq Z_{max} + \Phi_z x[0] \quad (23)$$

where $Z_{max} = z_{max}[1, \ldots, 1]^T$

Thus, the constraint represented by inequality (13) can come down to the constraint of the quadratic programming problem.

The track design of drilling processing shown in FIG. 4 will be considered by using the above-described track design method. Assume that holes are formed without any error in the X-axis direction, as described above. In this case, it suffices to consider the encoder output during drilling processing under the equality condition represented by equality (12). Also, assume that holes are formed with an error of ±1 µm in the Y-axis direction, as described above. It suffices to consider the encoder output under the inequality condition represented by inequality (13) so that (the upper limit value of) the dispersion of inclination vibrations (inclination angle) of the mirror during drilling processing becomes equal to or smaller than 2 µm. The track is obtained by numerical optimization to satisfy the equality condition and inequality condition.

Figure 7:
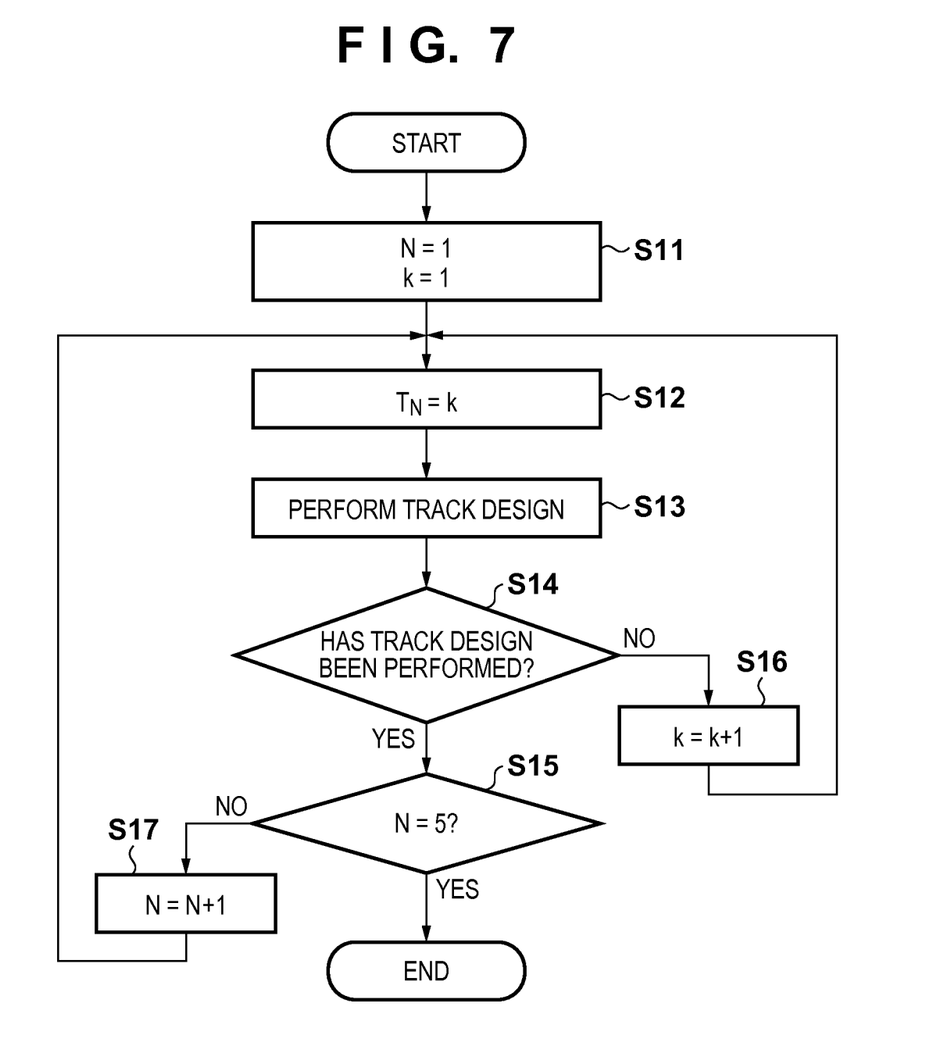
FIG. 7 is a flowchart for explaining the track design of drilling processing in the laser processing apparatus.

FIG. 7 is a flowchart for explaining the track design of drilling processing of forming five holes, as an example of continuous drilling processing. N is the number of holes to be formed, and assume that the track design of drilling processing up to the Nth hole is performed. k is the time. Since the controller of the discrete-time system is used, the unit is [sample]. $T_N$ is the time to start formation of the Nth hole, and corresponds to times T1, T2, T3, T4, and T5 shown in FIGS. 5A and 5B.

In step S11, N=1, and the track up to the first hole is designed. The time k for positioning is 1. The time $T_1$ to start formation of the first hole is set as one sample in step S12, and the track design is performed in step S13 under the setting condition in step S12. In step S14, it is determined whether the track design satisfying the setting condition has been performed. If the setting condition is severe, a solution satisfying the setting condition may not exist.

If the track design satisfying the setting condition has not been performed (that is, a solution satisfying the setting condition does not exist), the time k for positioning is increased by one sample in step S16, and the process returns to step S12 (to perform again the track design). This processing is repeated until a track design satisfying the setting condition is performed.

If the track design satisfying the setting condition has been performed (that is, a solution satisfying the setting condition exists), it is determined in step S15 whether the track up to the fifth hole has been designed (N=5?). If the track up to the fifth hole has not been designed, the number N of holes is incremented by one in step S17, and the process returns to step S12 (to continue the track design). When designing the track up to the Nth hole, processing is performed using times $T_1, \ldots, T_{N-1}$ obtained by the track design up to the (N−1)th hole. By repeating this processing, the track up to the fifth hole is designed.

Here, the track is designed to satisfy the following constraints.

Figure 8A:
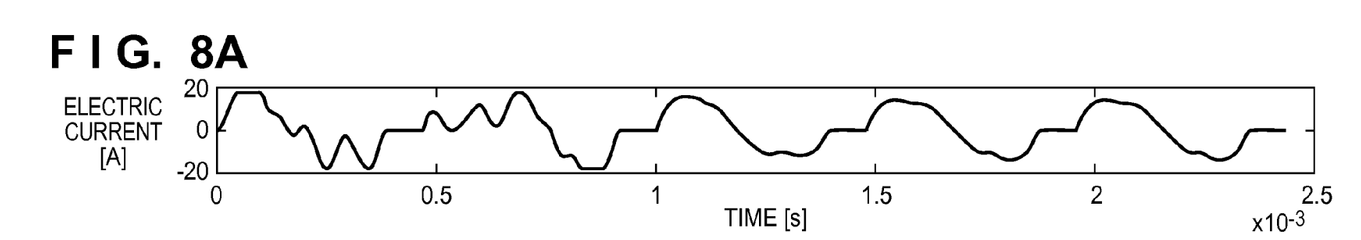
FIGS. 8A to 8D are graphs showing an example of the result of the track design using constraints.
Figure 8B:
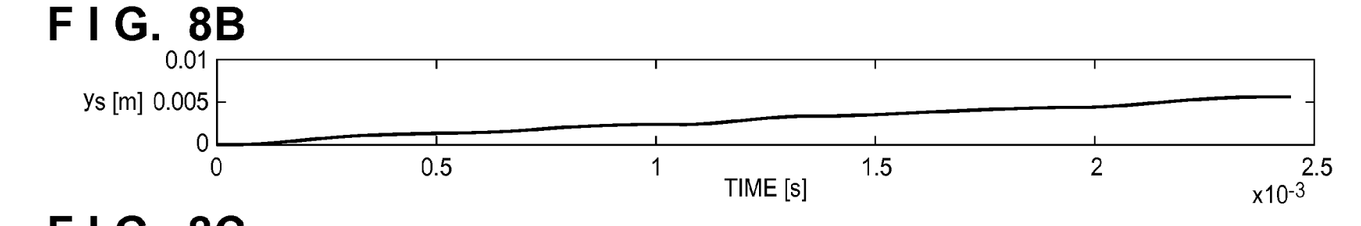
Figure 8C:
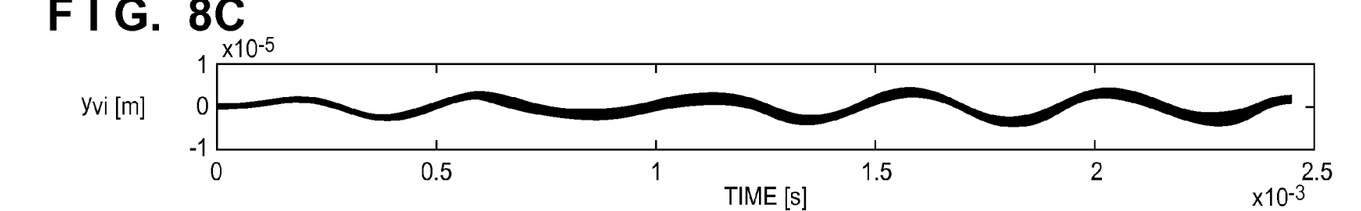
Figure 8D:
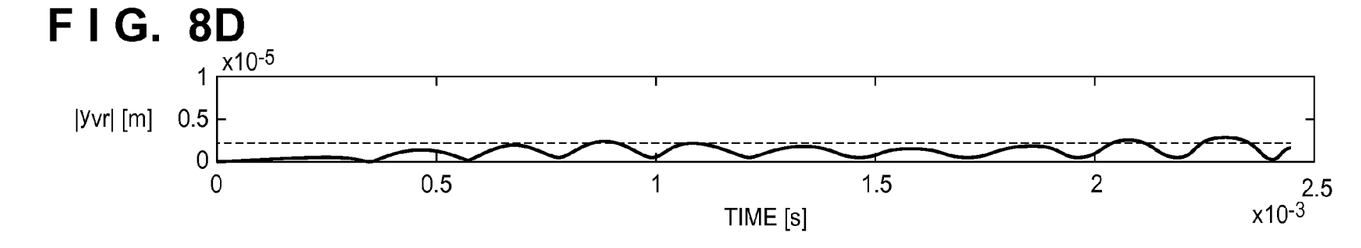

Constraints of First Hole:
  $y_s[k_1] = 1$ mm$(T_1 \leq k_1 \leq T_1')$
  $|y_{vr}[k_1]| \leq 2$ µm$(T_1 \leq k_1 \leq T_1')$ Constraints of Second Hole:
  $y_s[k_2] = 2$ mm$(T_2 \leq k_2 \leq T_2')$
  $|y_{vr}[k_2]| \leq 2$ µm$(T_2 \leq k_2 \leq T_2')$ Constraints of Third Hole:
  $y_s[k_3] = 3$ mm$(T_3 \leq k_3 \leq T_3')$
  $|y_{vr}[k_3]| \leq 2$ µm$(T_3 \leq k_3 \leq T_3')$ Constraints of Fourth Hole:
  $y_s[k_4] = 4$ mm$(T_4 \leq k_4 \leq T_4')$
  $|y_{vr}[k_4]| \leq 2$ µm$(T_4 \leq k_4 \leq T_4')$ Constraints of Fifth Hole:
  $y_s[k_5] = 5$ mm$(T_5 \leq k_5 \leq T_5')$
  $|y_{vr}[k_5]| \leq 2$ µm$(T_5 \leq k_5 \leq T_5')$ FIGS. 8A to 8D show the results of the track design using the above-described constraints. In FIG. 8A, the abscissa represents the time, and the ordinate represents the value of an electric current to be supplied to the motor (time-series data of an electric current to be supplied to the motor). In FIG. 8B, the abscissa represents the time, and the ordinate represents the encoder output $Y_s$ (rotation angle of the mirror). In FIG. 8C, the abscissa represents the time, and the ordinate represents a response $Y_{vi}$ (inclination angle) obtained from the model of inclination vibrations of the mirror. In FIG. 8D, the abscissa represents the time, and the ordinate represents dispersion (for example, variance, standard deviation, range of values) $Y_{vr}$ of responses obtained from the respective models of inclination vibrations of the mirror. In a section (stationary section) in which the mirror stands still at encoder outputs of 1 mm, 2 mm, 3 mm, 4 mm, and 5 mm, the value of an electric current to be supplied to the motor becomes 0. Further, in the stationary section, the dispersion of responses obtained from the respective models of inclination vibrations of the mirror is equal to or smaller than the constraint of 2 µm. By applying this track design to the galvano device, high-accuracy quick mirror positioning can be performed. The laser processing apparatus 1 can therefore perform high-accuracy quick laser processing.

Although the embodiment has described the track design using final-state control, another track design is also applicable. For example, frequency-shaped final-state control (FFSC) may be applied to suppress the resonance frequency of twist vibrations of the mirror. In FFSC, there is widely known a method of weighting an objective function to suppress an electric current component near the resonance frequency.

In the embodiment, the objective function (evaluation function) is a function for evaluating an electric current profile (time-series data), and is a function subjected to optimization (in other words, to satisfy an allowable condition, such as minimization). The objective function can include, for example, at least one of the sum of squares of the derivative value of the value (time-series data) of an electric current to be supplied to the motor of the galvano device, the magnitude of a specific frequency component of time-series data, and the sum of squares of the value of an electric current to be supplied to the motor. The objective function may also include the electric power consumption of an amplifier for an electric current to be supplied to the motor of the galvano device, the maximum value of the absolute value of the electric current to be supplied to the motor, and the maximum value of the absolute value of a voltage to be generated (applied) in the motor in accordance with an electric current to be supplied to the motor.

<Second Embodiment>

Figure 9:
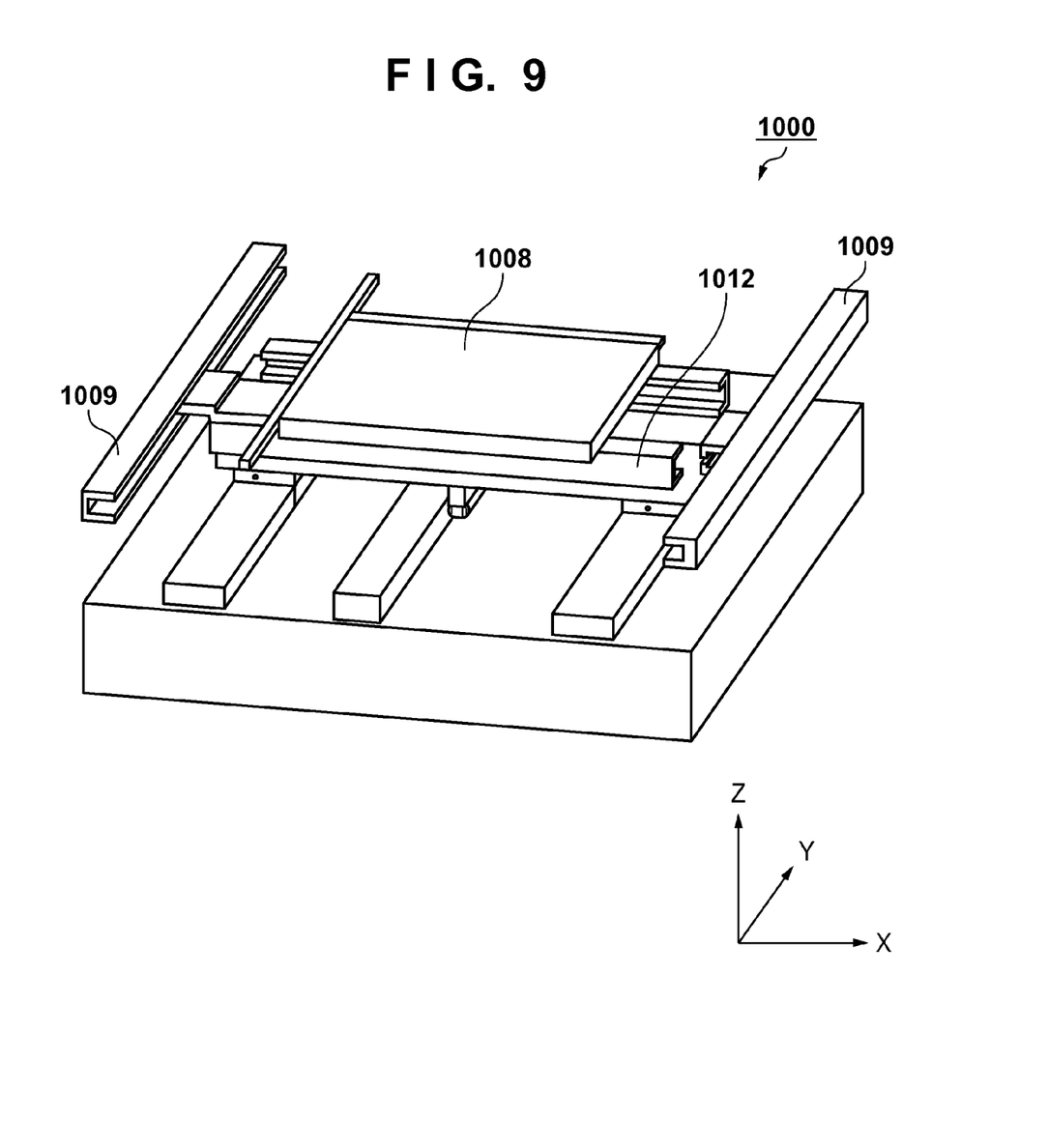
FIG. 9 is a schematic view showing the arrangement of a substrate stage in a lithography apparatus according to the second embodiment of the present invention.

The second embodiment will explain an example of an application to the substrate stage (X-Y stage) of a lithography apparatus such as an exposure apparatus. FIG. 9 is a schematic view showing the arrangement of a substrate stage 1000 in a lithography apparatus according to the second embodiment of the present invention. The lithography apparatus is an apparatus which forms a pattern on a substrate, and is implemented as, for example, an exposure apparatus, drawing apparatus, or imprint apparatus. The exposure apparatus is an apparatus which includes an illumination optical system configured to illuminate a reticle (mask), and a projection optical system configured to project the pattern of a reticle onto a substrate, and which transfers the pattern of a reticle onto a substrate. The drawing apparatus is an apparatus which draws a pattern on a substrate by using a charged particle beam (electron beam or ion beam). The imprint apparatus is an apparatus which cures a resin on a substrate while the resin is in contact with a mold, and separates the mold from the cured resin, thereby transferring a pattern onto the substrate.

As shown in FIG. 9, the substrate stage 1000 includes Y-axis motors 1009 used to move a stage 1008 in the Y-axis direction, and X-axis motors 1012 used to move the stage 1008 in the X-axis direction.

When the X-axis motors 1012 move the stage 1008 in the X-axis direction, movement (motion mode in a direction different from the direction in which the stage 1008 should be driven) of nonlinear components different from the movement in (the motion mode of) the X-axis direction exists in the stage 1008. Of these nonlinear components, a component in the Y-axis direction can be compensated for by the linear motion of the stage 1008 in the Y-axis direction by the Y-axis motor 1009.

Similarly, when the Y-axis motors 1009 move the stage 1008 in the Y-axis direction, movement (motion mode in a direction different from the direction in which the stage 1008 should be driven) of nonlinear components different from the movement in (the motion mode of) the Y-axis direction exists in the stage 1008. Of these nonlinear components, a component in the X-axis direction can be compensated for by the linear motion of the stage 1008 in the X-axis direction by the X-axis motor 1012.

Hence, as in the first embodiment, the motion mode of a non-linear component is modeled, and the track is designed to reduce the dispersion of a plurality of responses (displacements) obtained from respective models for estimating the displacement of the motion mode (specific mode) of the non-linear component. Accordingly, the displacement of the motion mode of the non-linear component of one stage can be compensated for by the other stage with high accuracy.

By applying the track design described in the first embodiment to the substrate stage of the lithography apparatus in this manner, the substrate stage can be quickly positioned with high accuracy. This lithography apparatus can provide a high-quality article, such as a semiconductor device, LCD element, image sensor (for example, CCD), or thin-film magnetic head, at high throughput and low cost. A method of manufacturing an article such as a device includes a step of forming a pattern on a substrate using the above-mentioned lithography apparatus, and a step of developing the substrate on which the pattern has been formed in the forming step. Subsequently to the above-described steps, this manufacturing method can include other well-known steps (for example, oxidization, deposition, vapor deposition, doping, planarization, etching, resist removal, dicing, bonding, and packaging). The manufacturing method according to the embodiment is superior to a conventional method in at least one of the performance, quality, productivity, and production cost of the article.

<Third Embodiment>

The third embodiment will explain a case in which a processing target object is arranged on the substrate stage described in the second embodiment in the laser processing apparatus 1 described in the first embodiment.

First, a case in which the substrate stage is positioned in the stationary state will be considered. When the mirror of a galvano device is successively positioned at the time of laser processing, the mirror vibrates in a direction in which the mirror inclines with respect to the rotating shaft of a motor, as described in the first embodiment. By this vibration, a laser irradiation position (processing position) on the target object vibrates. The influence of inclination vibrations of the mirror can be compensated for by moving the substrate stage holding the target object so as to attenuate vibrations of the processing position caused by inclination vibrations of the mirror of the galvano device. More specifically, as in the first embodiment, the track design is performed to reduce the dispersion of a plurality of responses obtained from respective models for estimating inclination vibrations of the mirror of the galvano device. Accordingly, the influence of inclination vibrations of the mirror of the galvano device can be compensated for by the substrate stage with high accuracy. The laser processing apparatus can quickly position a target object with high accuracy, and thus can implement high-accuracy quick laser processing.

<Fourth Embodiment>

In the first embodiment, an embodiment regarding control of a biaxial rotary motor has been explained. In the second embodiment, an embodiment regarding control of a biaxial linear motor has been explained. In the third embodiment, an embodiment in which a rotary motor and linear motor are combined has been explained. However, the present invention is not limited to them, and is also applicable to control of a multiaxial (triaxial or more) motor.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-227536 filed on Oct. 31, 2013, which is hereby incorporated by reference herein in its entirety.

What is claimed is:

1. A computer-readable storage medium which stores a program for causing a computer to generate time-series data of an electric current to be supplied to a motor in order to cause, a control system, including the motor configured to drive an object, to transit from a first state to a second state, the program causing the computer to generate the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance,
wherein the plurality of models correspond to respective different operating environments of the control system and estimate respective ones of the state quantity of the specific mode.

2. The medium according to claim 1, wherein the control system is configured to control a state quantity of a first mode of the vibration mode and the motion mode, and the state quantity of the specific mode is a state quantity of a second mode, different from the first mode, of the vibration mode and the motion mode.

3. The medium according to claim 2, wherein the state quantity of the first mode is a rotation angle of the object which rotates with a driving shaft of the motor, and the state quantity of the second mode is an inclination angle of the object.

4. The medium according to claim 2, wherein the state quantity of the first mode is a position, in a first direction, of the object which is driven by the motor in the first direction, and the state quantity of the second mode is a position of the object in a second direction orthogonal to the first direction.

5. The medium according to claim 1, wherein the respective operating environments are different from each other in a temperature of a space in which the control system is arranged.

6. The medium according to claim 1, wherein the evaluation function includes a sum of squares each of which is a square of a derivative value of the time-series data.

7. The medium according to claim 1, wherein the evaluation function includes a magnitude of a specific frequency component of the time-series data.

8. The medium according to claim 1, wherein the evaluation function includes a sum of squares each of which is a square of one of the time-series data.

9. The medium according to claim 1, wherein the evaluation function includes electric power consumption of an electric current amplifier configured to supply an electric current to the motor.

10. The medium according to claim 1, wherein the evaluation function includes a maximum value of absolute values of the time-series data.

11. The medium according to claim 1, wherein the evaluation function includes a maximum value of absolute values of voltages to be applied to the motor in accordance with the time-series data.

12. A generating method of generating time-series data of an electric current to be supplied to a motor in order to cause a control system, including the motor configured to drive an object, to transit from a first state to a second state, the method comprising:
obtaining the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance,
wherein the plurality of models correspond to respective different operating environments of the control system and estimate respective ones of the state quantity of the specific mode.

13. A generating apparatus which generates time-series data of an electric current to be supplied to a motor in order to cause a control system, including the motor configured to drive an object, to transit from a first state to a second state, the apparatus comprising:
a processor configured to obtain the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance, wherein the plurality of models correspond to respective different operating environments of the control system and estimate respective ones of the state quantity of the specific mode.

14. A driving apparatus which includes a control system including a motor configured to drive an object, the apparatus comprising:
a processor configured to obtain time-series data of an electric current to be supplied to the motor in order to cause the control system to transit from a first state to a second state,
the processor obtaining the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance, wherein the plurality of models correspond to respective different operating environments of the control system and estimate respective ones of the state quantity of the specific mode.

15. A processing apparatus which includes a mirror, and processes an object by irradiating the object with light via the mirror, the apparatus comprising:
- a driving apparatus in which the motor is configured to drive the mirror, wherein the driving apparatus comprises:
- a processor configured to obtain time-series data of an electric current to be supplied to the motor in order to cause a control system, including the motor, to transit from a first state to a second state,
- the processor obtaining the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance, wherein the plurality of models correspond to respective different operating environments of the control system and estimate respective ones of the state quantity of the specific mode.

16. A lithography apparatus which includes a stage configured to hold a substrate, and forms a pattern on the substrate held by the stage, the apparatus comprising:
- a driving apparatus in which the motor is configured to drive the stage, wherein the driving apparatus comprises:
- a processor configured to obtain time-series data of an electric current to be supplied to the motor in order to cause the control system to transit from a first state to a second state,
- the processor obtaining the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance, wherein the plurality of models correspond to respective different operating environments of the control system and estimate respective ones of the state quantity of the specific mode.

17. A method of manufacturing an article, the method comprising steps of:
- forming a pattern on a substrate using a lithography apparatus; and
- processing the substrate, on which the pattern has been formed, to manufacture the article,
- wherein the lithography apparatus forms the pattern on the substrate, and includes:
- a driving apparatus including a control system which includes a motor configured to drive an object, and a processor configured to obtain time-series data of an electric current to be supplied to the motor in order to cause the control system to transit from a first state to a second state,
- the processor obtaining the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance, wherein the plurality of models correspond to respective different operating environments of the control system and estimate respective ones of the state quantity of the specific mode.

18. A computer-readable storage medium which stores a program for causing a computer to generate time-series data of an electric current to be supplied to a motor in order to cause, a control system, including the motor configured to drive an object, to transit from a first state to a second state, the program causing the computer to generate the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance,
- wherein the control system controls a state quantity of a first mode of the vibration mode and the motion mode, and the state quantity of the specific mode is a state quantity of a second mode, different from the first mode, of the vibration mode and the motion mode.

19. A generating method of generating time-series data of an electric current to be supplied to a motor in order to cause a control system, including the motor configured to drive an object, to transit from a first state to a second state, the method comprising:
- obtaining the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance,
- wherein the control system controls a state quantity of a first mode of the vibration mode and the motion mode, and the state quantity of the specific mode is a state quantity of a second mode, different from the first mode, of the vibration mode and the motion mode.

20. A processing apparatus which includes a mirror, and processes an object by irradiating the object with light via the mirror, the apparatus comprising:
- a driving apparatus in which the motor is configured to drive the mirror, wherein the driving apparatus comprises:
- a processor configured to obtain time-series data of an electric current to be supplied to the motor in order to cause a control system, including the motor, to transit from a first state to a second state,
- wherein the processor is configured to obtain the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, and so that a value of an evaluation function for evaluating the time-series data falls within a tolerance, and
- wherein the control system is configured to control a state quantity of a first mode of the vibration mode and the motion mode, and the state quantity of the specific mode is a state quantity of a second mode, different from the first mode, of the vibration mode and the motion mode.

21. A computer-readable storage medium which stores a program for causing a computer to generate time-series data of an electric current to be supplied to a motor in order to cause, a control system, including the motor configured to drive an object, to transit from a first state to a second state, the program causing the computer to generate the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, the computer being caused to calculate the dispersion based on the plurality of models and the time-series data, and so that a value of an evaluation function for evaluating the time-series data falls within a tolerance.

22. A generating method of generating time-series data of an electric current to be supplied to a motor in order to cause a control system, including the motor configured to drive an object, to transit from a first state to a second state, the method comprising:
obtaining the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, the dispersion being calculated based on the plurality of models and the time-series data, and so that a value of an evaluation function for evaluating the time-series data falls within a tolerance.

23. A processing apparatus which includes a mirror, and processes an object by irradiating the object with light via the mirror, the apparatus comprising:
a driving apparatus in which the motor is configured to drive the mirror, wherein the driving apparatus comprises:
a processor configured to obtain time-series data of an electric current to be supplied to the motor in order to cause a control system, including the motor, to transit from a first state to a second state,
wherein the processor is configured to obtain the time-series data so as to satisfy a constraint including a condition to constrain an upper limit value of dispersion of a plurality of state quantities respectively obtained from a plurality of models each of which estimates, from the time-series data, a state quantity of a specific mode of a vibration mode and motion mode of the object, the processor being configured to calculate the dispersion based on the plurality of models and the time-series data, and so that a value of an evaluation function for evaluating the time-series data falls within a tolerance.

* * * * *